(12) United States Patent
Lin

(10) Patent No.: US 12,148,826 B2
(45) Date of Patent: *Nov. 19, 2024

(54) LATERAL DIFFUSED METAL OXIDE SEMICONDUCTOR DEVICE

(71) Applicant: UNITED MICROELECTRONICS CORP., Hsin-Chu (TW)

(72) Inventor: Zong-Han Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/383,461

(22) Filed: Oct. 24, 2023

(65) Prior Publication Data

US 2024/0055515 A1    Feb. 15, 2024

Related U.S. Application Data

(63) Continuation of application No. 17/533,056, filed on Nov. 22, 2021, now Pat. No. 11,843,049.

(30) Foreign Application Priority Data

Oct. 26, 2021   (CN) .......................... 202111263331.0

(51) Int. Cl.
*H01L 29/76*   (2006.01)
*H01L 29/06*   (2006.01)
*H01L 29/417*  (2006.01)
*H01L 29/78*   (2006.01)
*H01L 29/94*   (2006.01)

(52) U.S. Cl.
CPC ...... *H01L 29/7816* (2013.01); *H01L 29/0649* (2013.01); *H01L 29/41791* (2013.01); *H01L 29/7851* (2013.01)

(58) Field of Classification Search
CPC ............. H01L 29/7816; H01L 29/0649; H01L 29/41791; H01L 29/7851; H01L 27/0886; H01L 29/0653; H01L 29/66659; H01L 29/66795; H01L 29/7835; H01L 29/785
USPC .......................................... 257/343
See application file for complete search history.

(56) References Cited

U.S. PATENT DOCUMENTS 11,843,049 B2 * 12/2023 Lin ..................... H01L 29/7835
2015/0357462 A1   12/2015 Ponoth et al.
2021/0313181 A1 * 10/2021 Chen .................. H01L 27/0886
2021/0320172 A1 * 10/2021 Yu .................... H01L 21/823481

* cited by examiner

*Primary Examiner* — Theresa T Doan
(74) *Attorney, Agent, or Firm* — Winston Hsu

(57) ABSTRACT

A lateral diffused metal oxide semiconductor (LDMOS) device includes a first fin-shaped structure on a substrate, a second fin-shaped structure adjacent to the first fin-shaped structure, a shallow trench isolation (STI) between the first fin-shaped structure and the second fin-shaped structure, a first gate structure on the first fin-shaped structure, a second gate structure on the second fin-shaped structure, and an air gap between the first gate structure and the second gate structure.

5 Claims, 7 Drawing Sheets

LATERAL DIFFUSED METAL OXIDE SEMICONDUCTOR DEVICE

CROSS REFERENCE TO RELATED APPLICATIONS

This application is a continuation application of U.S. application Ser. No. 17/533,056, filed on Nov. 22, 2021. The content of the application is incorporated herein by reference.

BACKGROUND OF THE INVENTION

1. Field of the Invention

The invention relates to a semiconductor device, and more particularly, to a lateral diffused metal-oxide-semiconductor (LDMOS) device.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of LDMOS devise and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a lateral diffused metal oxide semiconductor (LDMOS) device includes a first fin-shaped structure on a substrate, a second fin-shaped structure adjacent to the first fin-shaped structure, a shallow trench isolation (STI) between the first fin-shaped structure and the second fin-shaped structure, a first gate structure on the first fin-shaped structure, a second gate structure on the second fin-shaped structure, and an air gap between the first gate structure and the second gate structure.

According to another aspect of the present invention, a lateral diffused metal oxide semiconductor (LDMOS) device includes a first fin-shaped structure on a substrate, a second fin-shaped structure adjacent to the first fin-shaped structure, a third fin-shaped structure between the first fin-shaped structure and the second fin-shaped structure, a first shallow trench isolation (STI) between the first fin-shaped structure and the third fin-shaped structure, a second STI between the second fin-shaped structure and the third fin-shaped structure, a first gate structure on the first fin-shaped structure, a second gate structure on the second fin-shaped structure, a third gate structure on the third fin-shaped structure, and a first air gap between the first gate structure and the third gate structure.

According to yet another aspect of the present invention, a lateral diffused metal oxide semiconductor (LDMOS) device includes a first fin-shaped structure on a substrate, a second fin-shaped structure adjacent to the first fin-shaped structure, a shallow trench isolation (STI) between the first fin-shaped structure and the second fin-shaped structure, a first gate structure on the first fin-shaped structure, a second gate structure on the second fin-shaped structure, a third gate structure on the STI, and a first air gap between the first gate structure and the third gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
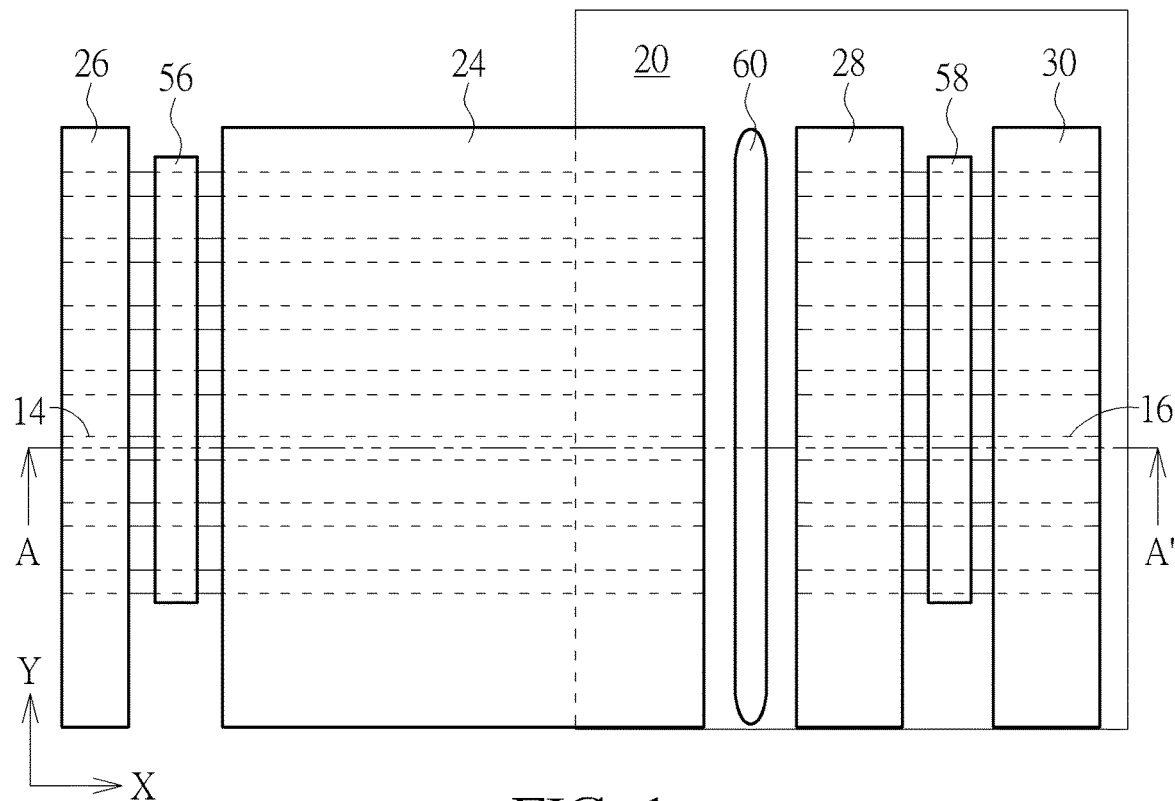
FIGS. 1-4 illustrate a method for fabricating a LDMOS device according to an embodiment of the present invention.
Figure 2:
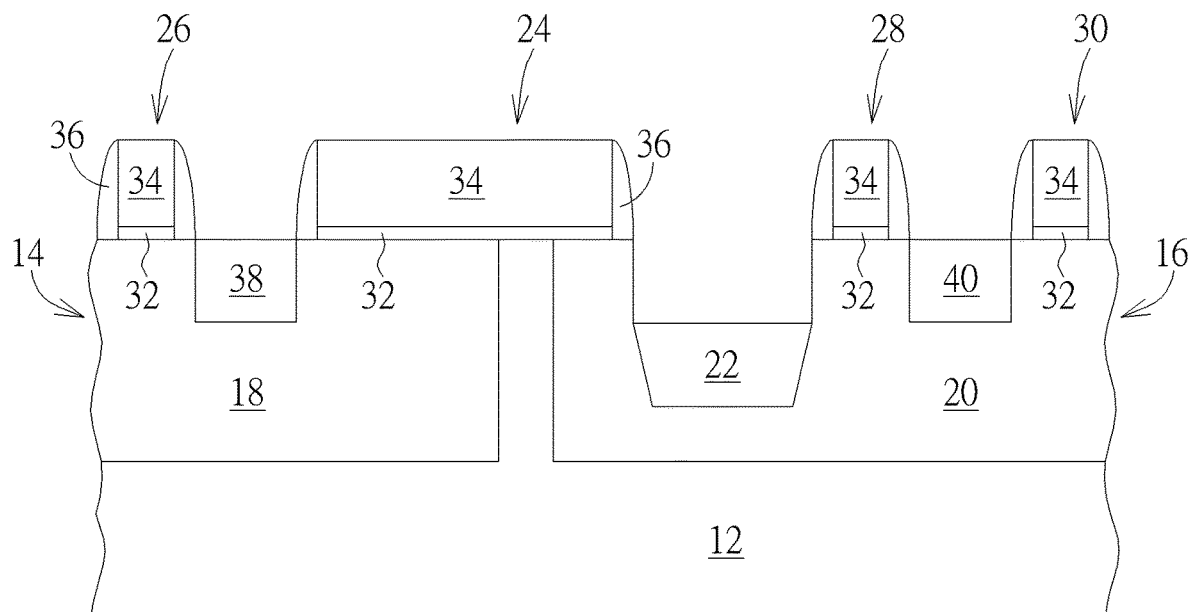
Figure 3:
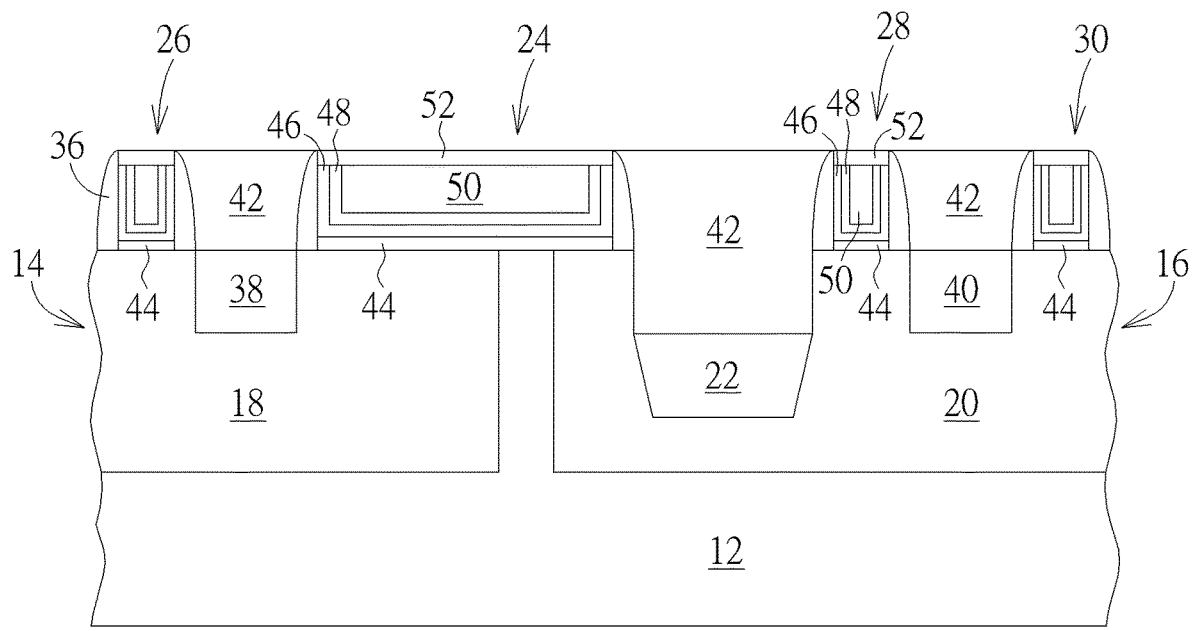
Figure 4:
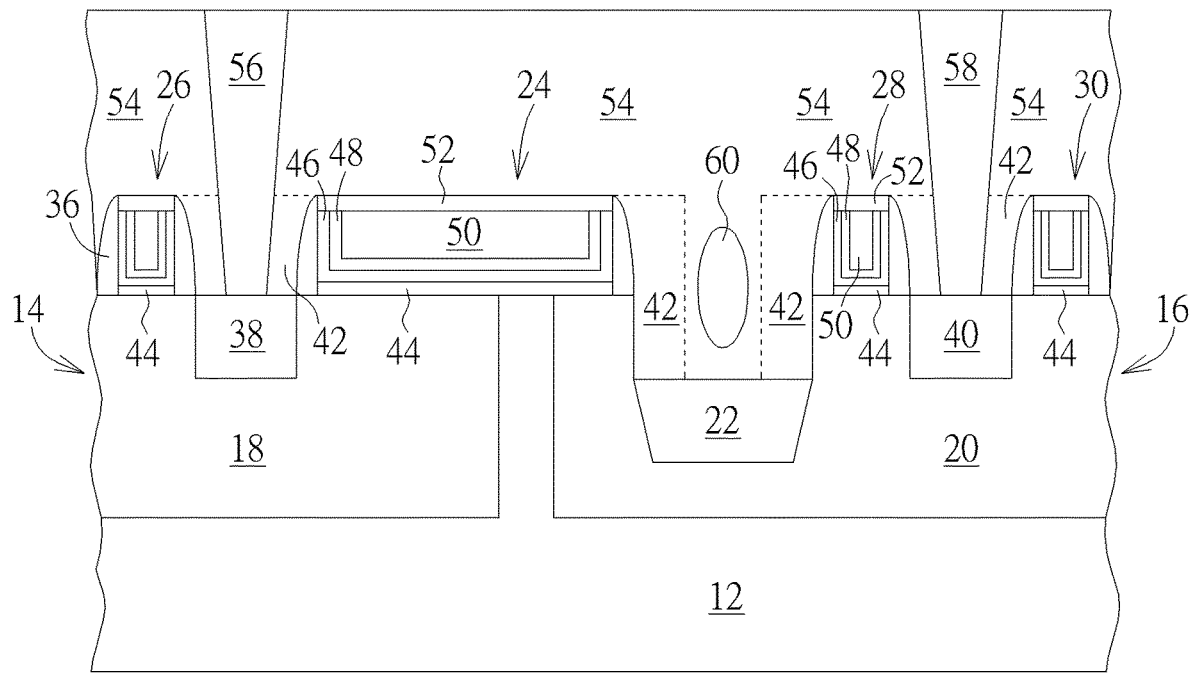

Referring to FIGS. 1-4, FIGS. 1-4 illustrate a method for fabricating a LDMOS device according to an embodiment of the present invention, in which FIG. 1 illustrates a top view for fabricating the LDMOS device and FIGS. 2-4 illustrate cross-section views of FIG. 1 taken along the sectional line AA' for fabricating the LDMOS device. As shown in FIGS. 1-2, a substrate 12 is first provided and a plurality of fin-shaped structures such as a first fin-shaped structure 14 and a second fin-shaped structure 16 are formed on the substrate 12, a first well (such as p-well 18) and a second well (such as n-well 20) are formed in the first fin-shaped structure 14 and the second fin-shaped structure 16, and a shallow trench isolation (STI) 22 is formed between the first fin-shaped structure 14 and the second fin-shaped structure 16. Preferably, the top surface of the STI 22 is slightly lower than the top surface of the first fin-shaped structure 14 and the second fin-shaped structure 16, the first well (such as p-well 18) is completely disposed within the first fin-shaped structure 14, the second well (such as n-well 20) is disposed in both the second fin-shaped structure 16 and first fin-shaped structure 14, and the STI 22 is also disposed in or surrounded by the second well (such as n-well 20) completely.

In this embodiment, the substrate 12 could be a semiconductor substrate such as a silicon substrate, an epitaxial substrate, a SiC substrate, or a silicon-on-insulator (SOI) substrate and the shallow trench isolation (STI) 22 is preferably made of silicon oxide, but not limited thereto. It should also be noted that even though seven first fin-shaped structures 14 and seven second fin-shaped structures 16 are disposed extending along the Y-direction on the substrate 12 in the embodiment shown in FIG. 1, the quantity of the fin-shaped structures are not limited to seven but could all be adjusted depending on the demand of the product.

According to an embodiment of the present invention, the first fin-shaped structure 14 and the second fin-shaped structure 16 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate 12, and through an etching process, the pattern of the patterned mask is transferred to the substrate 12 to form the first fin-shaped structure 14 and the second fin-shaped structure 16. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding first fin-shaped structure 14 and second fin-shaped structure 16. These approaches for forming fin-shaped structures are all within the scope of the present invention.

Next, a gate structure 24 is formed on the first fin-shaped structure 14, a gate structure 26 is formed on the first fin-shaped structure 14 on the left side of the gate structure 24, and a gate structure 28 and gate structure 30 are formed on the second fin-shaped structure 16. In this embodiment, the formation of the gate structures 24, 26, 28, 30 could be accomplished by a gate first process, a high-k first approach from gate last process, or a high-k last approach from gate last process. Since this embodiment pertains to a high-k last approach, a gate dielectric layer 32 or interfacial layer made of silicon oxide, a gate material layer 34 made of polysilicon, and a selective hard mask (not shown) could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 24, 26, 28, 30 each composed of a patterned gate dielectric layer 32 and a patterned gate material layer 34 are formed on the substrate 12.

Next, at least a spacer 36 is formed on the sidewalls of each of the gate structures 24, 26, 28, 30, a source region 38 composed of n+ region is formed in the first fin-shaped structure 14 adjacent to one side of the gate structure 24, and a drain region 40 composed of another n+ region is formed in the second fin-shaped structure 16 adjacent to another side of the gate structure 28. In this embodiment, each of the spacers 36 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source region 38 and the drain region 40 could include n-type dopants or p-type dopants depending on the type of device being fabricated.

Next, as shown in FIG. 3, an interlayer dielectric (ILD) layer 42 is formed on the gate structures 24, 26, 28, 30 and the STI 22 and a planarizing process such as chemical mechanical polishing (CMP) process is conducted to remove part of the ILD layer 42 for exposing the gate material layers 34 made of polysilicon so that the top surfaces of the gate material layers 34 and the ILD layer 42 are coplanar. Next, a replacement metal gate (RMG) process is conducted to transform the gate structures 24, 26, 28, 30 into metal gates. For instance, the RMG process could be accomplished by first forming a selective patterned mask (not shown) on the ILD layer 42, conducting a selective dry etching or wet etching process using etchants including but not limited to for example ammonium hydroxide ($NH_4OH$) or tetramethylammonium hydroxide (TMAH) to remove the gate material layer 34 and even the gate dielectric layer 32 from gate structures 24, 26, 28, 30 for forming recesses (not shown) in the ILD layer 42. Next, a selective interfacial layer 44 or gate dielectric layer (not shown), a high-k dielectric layer 46, a work function metal layer 48, and a low resistance metal layer 50 are formed in the recesses, and a planarizing process such as CMP is conducted to remove part of low resistance metal layer 50, part of work function metal layer 48, and part of high-k dielectric layer 46 so that the top surfaces of the U-shape high-k dielectric layer 46, U-shaped work function metal layer 48, the low resistance metal layer 50, and the ILD layer 42 are coplanar.

In this embodiment, the high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof. Next, part of the high-k dielectric layer 46, part of the work function metal layer 48, and part of the low resistance metal layer 50 are removed to form a recess (not shown), and a hard mask 52 is then formed into each of the recesses so that the top surfaces of the hard masks 52 and ILD layer 42 are coplanar. The hard masks 52 could be made of material including but not limited to for example SiO$_2$, SiN, SiON, SiCN, or combination thereof.

Next, as shown in FIG. 4, a photo-etching process is conducted to remove part of the ILD layer 42 directly on top of the STI 22 for forming a trench (not shown) exposing or not exposing the surface of the STI 22, and then a deposition process is conducted to form an air gap 60 on top of the STI 22. Specifically, the formation of the air gap 60 could be accomplished by first conducting a flowable chemical vapor deposition (FCVD) process to conformally form a liner (not shown) in the trench without filling the trench completely, selectively performing an etching back process to remove part of the liner, and then conducting a high-density plasma (HDP) process to form a dielectric layer such as another ILD layer 54 on the liner for filling the trench between the gate structures 24, 28 completely while covering the gate structures 24, 26, 28, 30. By using the combination of FCVD process and HDP process, it would be desirable to fill the aforementioned trench with dielectric material such as the ILD layer 54 while forming an air gap 60 directly on top of the STI 22 at the same time. In this embodiment, the ILD layers 42, 54 could be made of same or different materials, in which the ILD layers 42, 54 could include silicon oxide such as tetraethyl orthosilicate (TEOS) or an ultra low-k (ULK) dielectric layer including but not limited to for example porous material or silicon oxycarbide (SiOC) or carbon doped silicon oxide (SiOCH).

Next, a photo-etching process is conducted by using a patterned mask (not shown) as mask to remove part of the ILD layers 42, 54 adjacent to the gate structures 24, 26, 28, 30 for forming contact holes (not shown) exposing the source region 38 and the drain region 40. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned conductive materials for forming a contact plug 56 directly contacting the source region 38 and a contact plug 58 directly contacting the drain region 40. This completes the fabrication of a semiconductor device according to an embodiment of the present invention.

Referring again to FIGS. 1 and 4, FIGS. 1 and 4 further illustrate structural views of a LDMOS device according to an embodiment of the present invention, in which FIG. 1 illustrates a top view of the LDMOS device and FIG. 4 illustrates a cross-section view of the LDMOS device taken along the sectional line AA' of FIG. 1. As shown in FIG. 4, the LDMOS device includes a first fin-shaped structure 14 and a second fin-shaped structure 16 disposed on the substrate 12, a STI 22 disposed between the first fin-shaped structure 14 and the second fin-shaped structure 16, a gate structure 24 disposed on the first fin-shaped structure 14, a gate structure 28 disposed on the second fin-shaped structure 16, a source region 38 disposed adjacent to one side of the gate structure 24 on the first fin-shaped structure 14, a drain region 40 disposed adjacent to one side of the gate structure 28 on the second fin-shaped structure 16, ILD layers 42, 24 disposed around the gate structures 24, 28, a contact plug 56 disposed on the source region 38, a contact plug 58 disposed on the drain region 40, and an air gap 60 disposed between the gate structures 24, 28 and directly on top of the STI 22. As shown in FIG. 1, the first fin-shaped structure 14 and the second fin-shaped structure 16 are disposed extending along a first direction such as X-direction while the contact plugs 56, 58 and the air gap 60 are disposed extending along a second direction such as Y-direction on the substrate 12.

In this embodiment, each of the gate structures 24, 26, 28, 30 includes a metal gate, the gate structures 26, 28, 30 are preferably dummy gates and the width of each of the gate structures 26, 28, 30 is less than the width of the gate structure 24, and the air gap 60 is disposed within the ILD layer 54. It should be noted that even though the top surface of the air gap 60 is slightly lower than the top surfaces of the gate structures 24, 28 on adjacent two sides, according to other embodiment of the present invention, the top surface of the air gap 60 could also be even with or slightly higher than the top surfaces of the gate structures 24, 28, which are all within the scope of the present invention.

Figure 5:
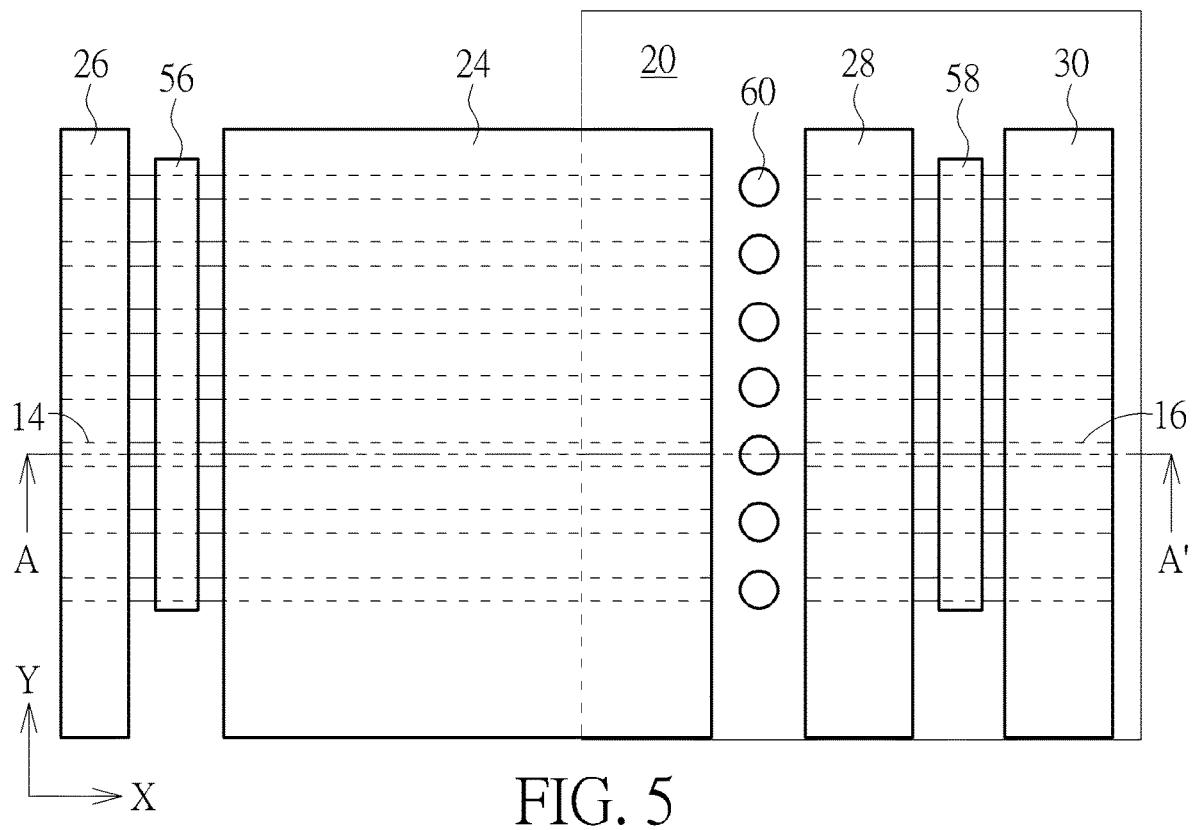
FIG. 5 illustrates a top view of a LDMOS device according to an embodiment of the present invention.

Referring to FIG. 5, FIG. 5 illustrates a top view of a LDMOS device according to an embodiment of the present invention. As shown in FIG. 5, in contrast to the air gap 60 in FIG. 1 is disposed extending along Y-direction on the STI 22 and having elongated stripe shape as contact plugs 56, 58 on adjacent two sides, it would also be desirable to adjust the shape of the mask used during photo-etching process conducted in FIG. 4 for removing part of the ILD layer 42 directly on top of the STI 22 to form a plurality of circular openings (not shown), and then conduct the aforementioned FCVD and HDP processes to fill liner and ILD layer 54 into the openings and at the same time form circular air gaps 60 between the gate structures 24, 28 and directly on top of the STI 22 under a top view perspective. In this embodiment, height and/or width of each of the air gaps 60 under a cross-section perspective could be substantially the same as the air gap 60 shown in FIG. 4. It should be noted that each of the air gaps 60 is disposed between the fin-shaped structures or more specifically each of the air gaps 60 and the fin-shaped structures 14, 16 on adjacent two sides could form a straight line extending along X-direction, the number of the air gaps 60 is preferably the same as the number of fin-shaped structures on adjacent two sides. In other words, if seven fin-shaped structures are disposed adjacent to two sides of each of the air gaps 60 in this embodiment, there would be seven air gaps 60 disposed directly on the STI 22 between the gate structures 24, 28.

Figure 6:
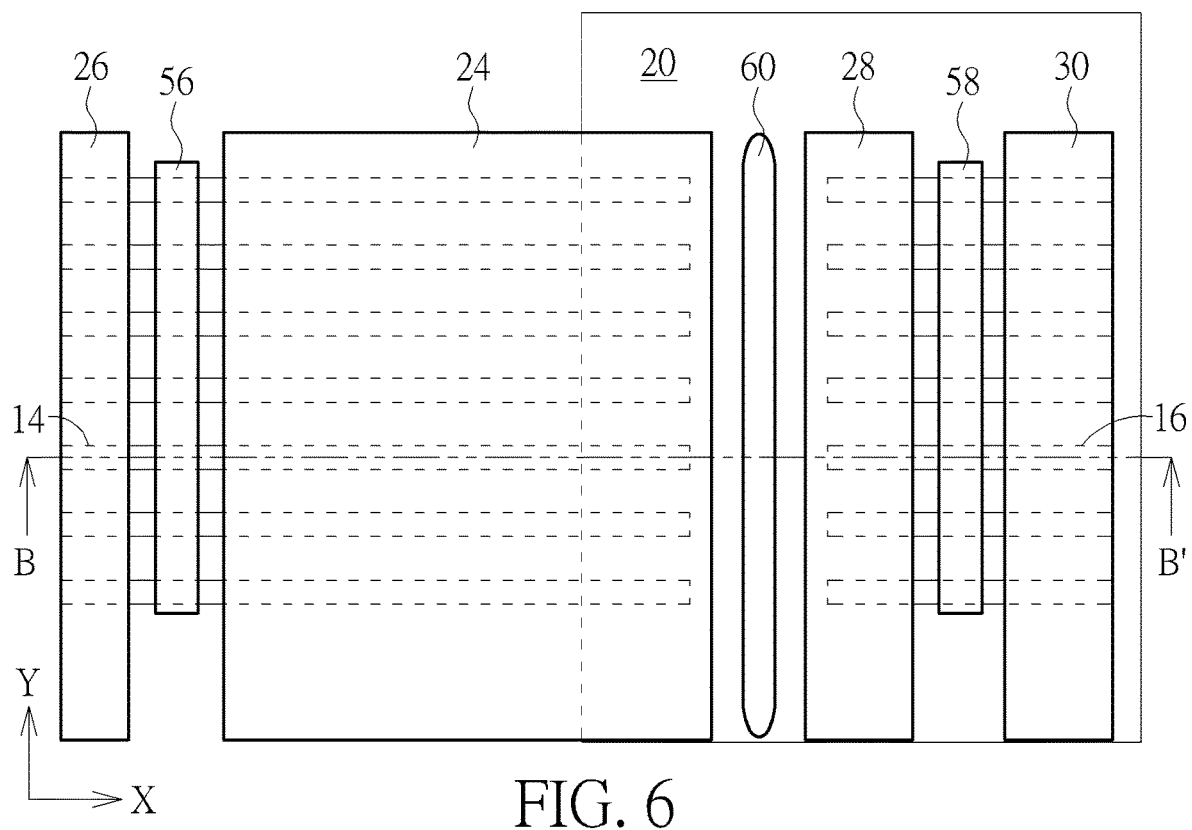
FIG. 6 illustrates a top view of the LDMOS device according to an embodiment of the present invention.
Figure 7:
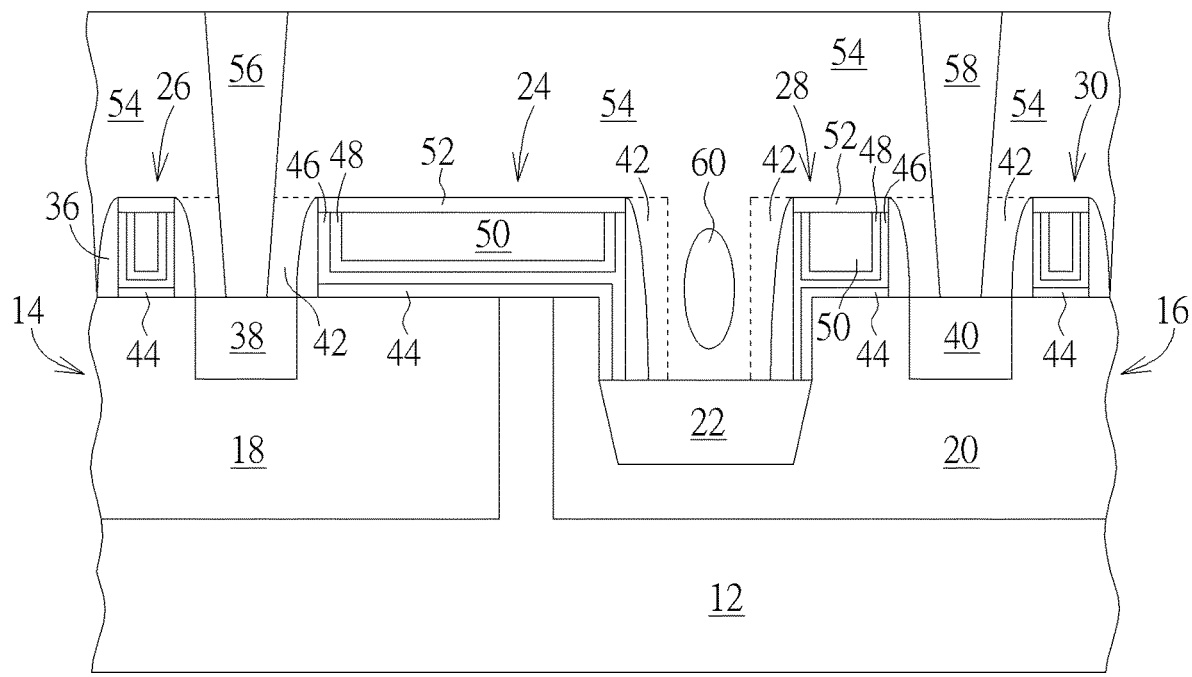
FIG. 7 illustrates a cross-section view of the LDMOS device taken along the sectional line BB' of FIG. 6.

Referring to FIGS. 6-7, FIG. 6 illustrates a top view of the LDMOS device according to an embodiment of the present invention and FIG. 7 illustrates a cross-section view of the LDMOS device taken along the sectional line BB' of FIG. 6. As shown in FIGS. 6-7, in contrast to sidewall of the gate structure 24 or spacer 36 adjacent to gate structure 24 in FIG.

4 is aligned with sidewall of the first fin-shaped structure 14 underneath and the sidewall of the gate structure 28 or spacer 36 adjacent to gate structure 28 is also aligned with sidewall of the second fin-shaped structure 16, the sidewalls of the gate structures 24, 28 adjacent to two sides of the STI 22 in this embodiment are not aligned with sidewalls of the fin-shaped structures 14, 16 underneath. Specifically, the sidewall of the gate structure 24 on left side of the STI 22 is slightly extended to the right to directly contact the top surface of the STI 22 and the sidewall of the gate structure 28 on right side of the STI 22 is slightly extended to the left to directly contact the top surface of the STI 22.

Figure 8:
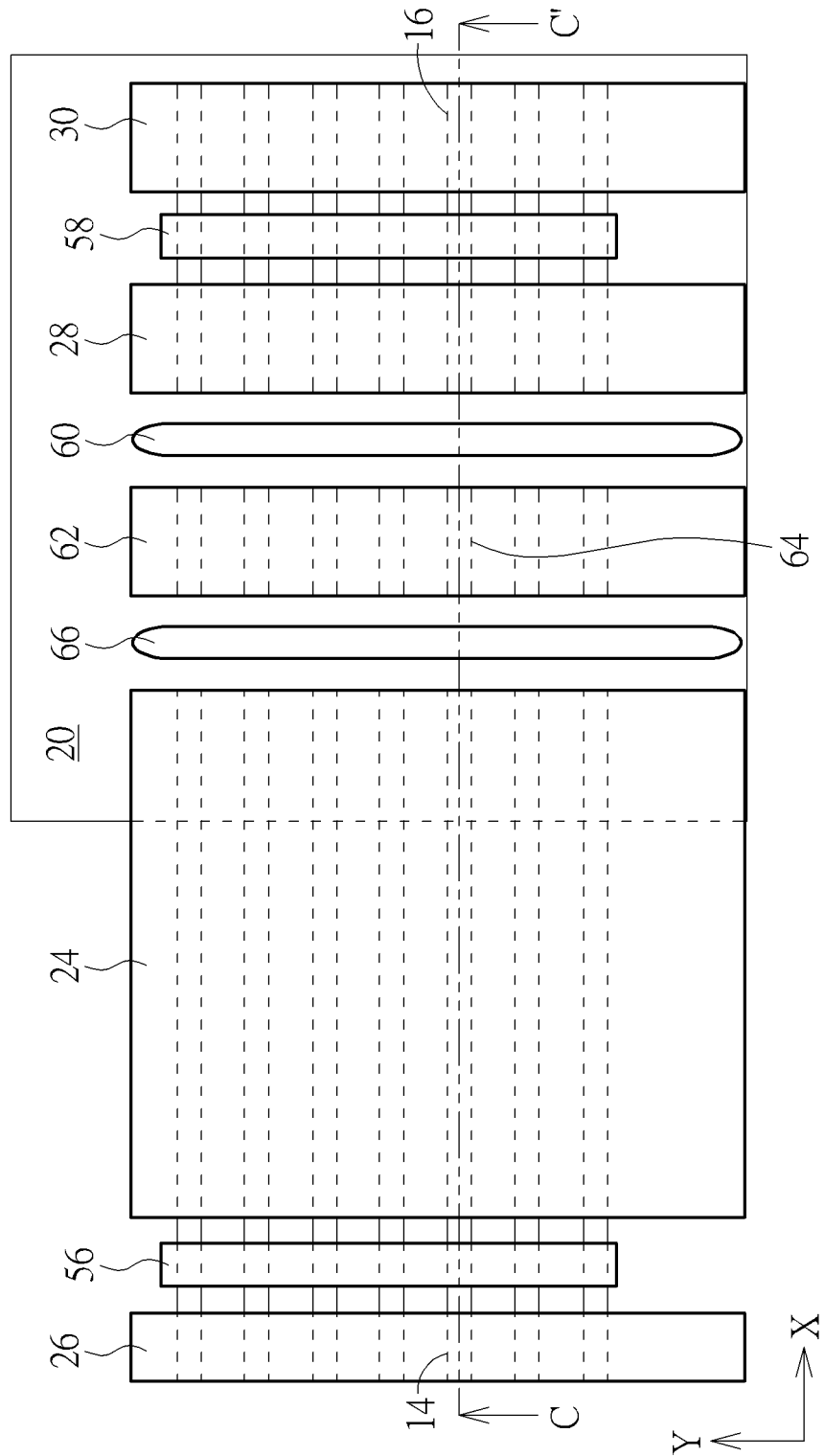
FIG. 8 illustrates a top view of the LDMOS device according to an embodiment of the present invention.
Figure 9:
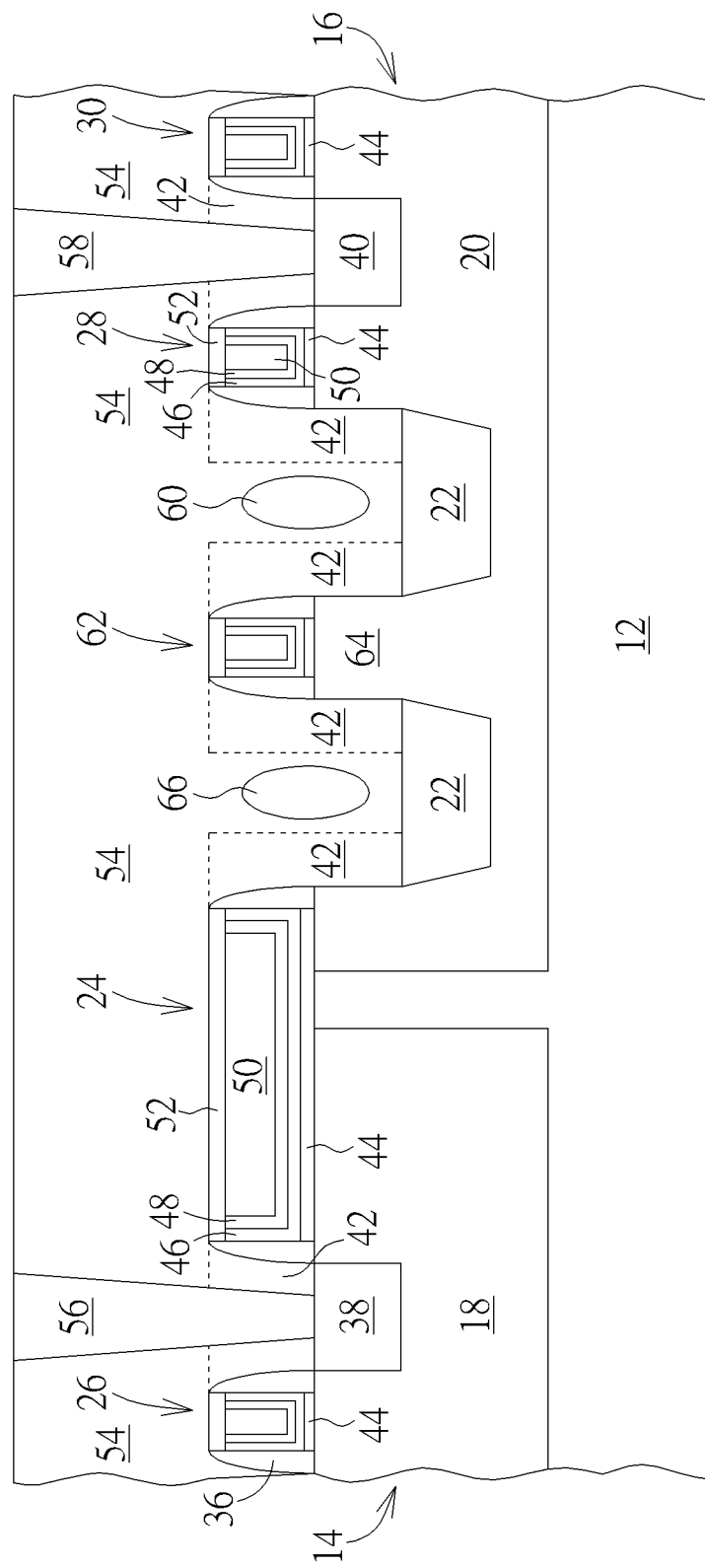
FIG. 9 illustrates a cross-section view of the LDMOS device taken along the sectional line CC' of FIG. 8.

Referring to FIGS. 8-9, FIG. 8 illustrates a top view of the LDMOS device according to an embodiment of the present invention and FIG. 9 illustrates a cross-section view of the LDMOS device taken along the sectional line CC' of FIG. 8. As shown in FIGS. 8-9, it would also be desirable to form another gate structure 62 on a third fin-shaped structure 64, form a STI 22 between the gate structures 24 and 62, form a STI 22 between the gate structures 28 and 62, and form air gaps 60, 66 adjacent to two sides of the gate structure 62 and on top of the STI 22.

In this embodiment, the gate structure 62 and the gate structures 24, 28 are preferably fabricated from the same process thereby having same material such as all three gate structures 24, 28, 62 are made of metal gates. Moreover, even though the top surfaces of the air gaps 60, 66 are slightly lower than the top surfaces of the gate structures 24, 28 on adjacent to two sides, according to other embodiment of the present invention the top surface of each of the air gaps 60, 66 could also be even with or slightly higher than the top surface of the gate structures 24, 28, 62, which are all within the scope of the present invention. Furthermore, despite the air gaps 60, 66 shown in FIG. 8 are disposed extending along the Y-direction on the STI 22 while having elongated stripe shape as the contact plugs 56, 58 on two adjacent sides, according to other embodiment of the present invention it would also be desirable to form a plurality of circular air gaps 60, 66 such as the ones shown in FIG. 5 under top view perspective adjacent to two sides of the gate structure 62 and directly on top of the STI 22, which is also within the scope of the present invention.

Figure 10:
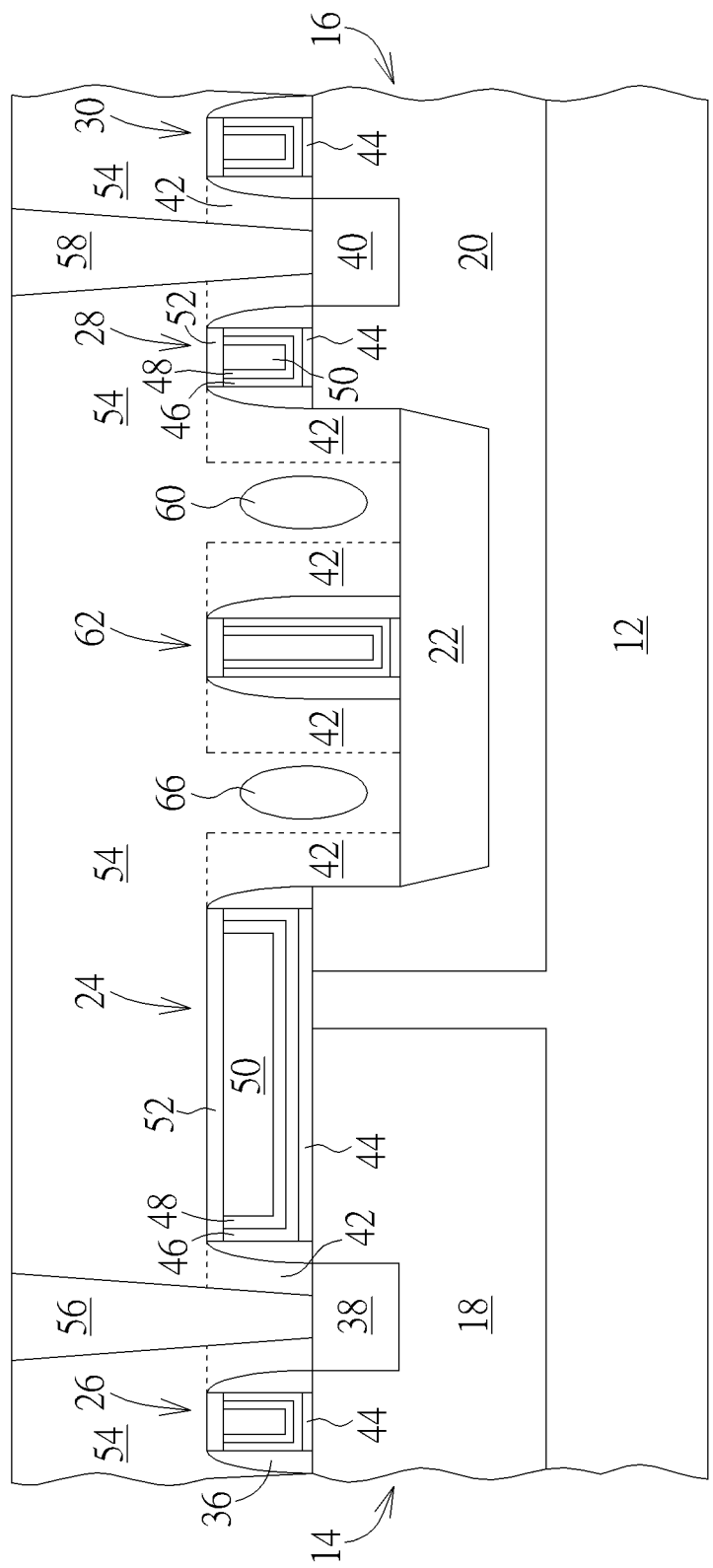
FIG. 10 illustrates a structural view of a LDMOS device according to an embodiment of the present invention.

Referring to FIG. 10, FIG. 10 illustrates a structural view of a LDMOS device according to an embodiment of the present invention. As shown in FIG. 10, in contrast to forming the gate structure 62 on the third fin-shaped structure 64, it would also be desirable to form the gate structure 62 on top of the STI 22 during the fabrication of the gate structures 24, 26, 28, 30, and then follow the processes conducted in FIGS. 3-4 to transform the gate structures 24, 26, 28, 30, 62 into metal gates and then form air gaps 60, 66 adjacent to two sides of the gate structure 62. Similar to the aforementioned embodiment, even though the top surfaces of the air gaps 60, 66 are slightly lower than the top surfaces of the gate structures 24, 28 on adjacent to two sides, according to other embodiment of the present invention the top surface of each of the air gaps 60, 66 could also be even with or slightly higher than the top surface of the gate structures 24, 28, 62, which are all within the scope of the present invention. Moreover, similar to the aforementioned embodiments, the air gaps 60, 66 adjacent to two sides of the gate structure 62 could have elongated stripe shape or circular shape under a top view perspective depending on the demand of the product, which are all within the scope of the present invention.

Overall, the present invention preferably forms at least one air gap between a main gate such as the gate structure 24 and a dummy gate such as the gate structure 28 and directly on top of the STI, in which the presence of the air gap could not only reduce parasitic capacitance of the LDMOS device but also improve cut-off frequency (FT) and maximum oscillation frequency (Fmax) significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral diffused metal oxide semiconductor (LDMOS) device, comprising:
   a first fin-shaped structure on a substrate;
   a second fin-shaped structure adjacent to the first fin-shaped structure,
   a shallow trench isolation (STI) between the first fin-shaped structure and the second fin-shaped structure;
   a first gate structure on the first fin-shaped structure;
   a second gate structure on the second fin-shaped structure; and
   an air gap between the first gate structure and the second gate structure and directly on the STI.

2. The LDMOS device of claim 1, further comprising:
   a source region adjacent to one side of the first gate structure on the first fin-shaped structure;
   a drain region adjacent to one side of the second gate structure on the second fin-shaped structure;
   an interlayer dielectric (ILD) layer around the first gate structure and the second gate structure; and
   a first contact plug on the source region and a second contact plug on the drain region.

3. The LDMOS device of claim 2, wherein the air gap is in the ILD layer.

4. The LDMOS device of claim 1, wherein a width of the second gate structure is less than a width of the first gate structure.

5. The LDMOS device of claim 1, wherein the first gate structure and the second gate structure comprise metal gates.

* * * * *